US010273813B2

(12) United States Patent
Kittleson et al.

(10) Patent No.: US 10,273,813 B2
(45) Date of Patent: Apr. 30, 2019

(54) CERAMIC MATRIX COMPOSITE COMPONENT AND PROCESS OF PRODUCING A CERAMIC MATRIX COMPOSITE COMPONENT

(71) Applicant: GENERAL ELECTRIC COMPANY, Schenectady, NY (US)

(72) Inventors: Jacob John Kittleson, Greenville, SC (US); James Joseph Murray, III, Piedmont, SC (US)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 596 days.

(21) Appl. No.: 14/926,803

(22) Filed: Oct. 29, 2015

(65) Prior Publication Data

US 2017/0122114 A1    May 4, 2017

(51) Int. Cl.
| | |
|---|---|
| *F01D 5/28* | (2006.01) |
| *B32B 18/00* | (2006.01) |
| *C04B 35/80* | (2006.01) |
| *F01D 5/20* | (2006.01) |
| *C23C 16/22* | (2006.01) |
| *F01D 9/04* | (2006.01) |

(52) U.S. Cl.
CPC .............. *F01D 5/282* (2013.01); *B32B 18/00* (2013.01); *C04B 35/80* (2013.01); *C04B 35/803* (2013.01); *C23C 16/22* (2013.01); *F01D 5/20* (2013.01); *F01D 5/284* (2013.01); *F01D 9/041* (2013.01); *C04B 2235/6028* (2013.01); *C04B 2235/614* (2013.01); *C04B 2235/616* (2013.01); *C04B 2237/38* (2013.01); *C04B 2237/62* (2013.01); *C04B 2237/84* (2013.01); *F05D 2220/32* (2013.01); *F05D 2230/314* (2013.01); *F05D 2300/6033* (2013.01)

(58) Field of Classification Search
CPC ........ F01D 5/282; F01D 5/284; C04B 35/803
See application file for complete search history.

(56) References Cited

U.S. PATENT DOCUMENTS

| | | | |
|---|---|---|---|
| 8,740,571 B2 | 6/2014 | Garcia-Crespo | |
| 2011/0206522 A1* | 8/2011 | Alvanos | F01D 5/282 416/204 R |
| 2013/0171426 A1 | 7/2013 | de Diego et al. | |
| 2013/0251939 A1 | 9/2013 | Kleinow | |
| 2014/0193577 A1 | 7/2014 | Monaghan et al. | |
| 2014/0199174 A1* | 7/2014 | Roberts, III | F01D 5/147 416/232 |

OTHER PUBLICATIONS

Extended European Search Report and Opinion issued in connection with corresponding EP Application No. 16195339.3 dated Mar. 8, 2017.

* cited by examiner

*Primary Examiner* — Richard A Edgar
*Assistant Examiner* — Michael L Sehn
(74) *Attorney, Agent, or Firm* — McNees Wallace & Nurick LLC

(57) ABSTRACT

A process of producing a ceramic matrix composite component. The process includes positioning core plies on a mandrel. At least partially rigidizing the core plies to form a preform ceramic matrix composite arrangement defining a tip cavity and a hollow region. Ceramic matrix composite tip plies are positioned on the preform ceramic matrix composite arrangement and within the tip cavity. The ceramic matrix composite tip plies are densified to form a tip region of the composite component.

20 Claims, 5 Drawing Sheets

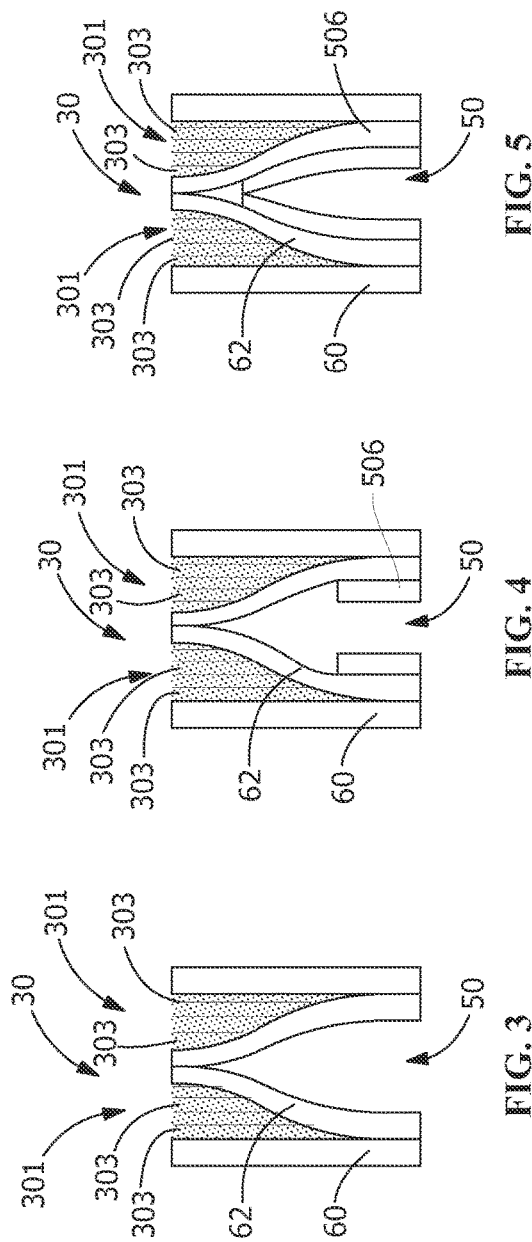

CERAMIC MATRIX COMPOSITE COMPONENT AND PROCESS OF PRODUCING A CERAMIC MATRIX COMPOSITE COMPONENT

STATEMENT REGARDING FEDERALLY SPONSORED RESEARCH

This invention was made with Government support under contract number DE-FC26-05NT42643 awarded by the Department of Energy. The Government has certain rights in the invention.

FIELD OF THE INVENTION

The present invention relates generally to gas turbines for power generation and more specifically to methods of forming ceramic matrix composite components for hot gas path turbine components for gas turbines.

BACKGROUND OF THE INVENTION

As with turbine blades and vanes formed from more conventional superalloy materials, CMC blades and vanes are primarily equipped with internal cavities to reduce weight, reduce centrifugal load, and reduce operating temperatures of the components. These features are typically formed in CMC components using a combination of removable and expendable tooling. Internal cooling channels are advantageous for cooling both metal and CMC hot-gas path hardware as they reduce cooling flow requirements and thermal gradients/stress.

Silicon carbide (SiC)-based ceramic matrix composite (CMC) materials have been proposed as materials for certain components of gas turbine engines, such as the turbine blades, vanes, nozzles, and buckets. Various methods are known for fabricating SiC-based components, including Silicomp, melt infiltration (MI), chemical vapor infiltration (CVI), polymer inflation pyrolysis (PIP), and oxide/oxide processes. Though these fabrication techniques significantly differ from each other, each involves the use of hand lay-up and tooling or dies to produce a near-net-shape part through a process that includes the application of heat at various processing stages.

After the burn-out cycle, the CMC preform blade is very fragile due to burn-off of the volatile substances of the composite. The open tip area of the CMC preform requires capping or closing before use in gas turbines. In known processes, to close the open tip area of the CMC preform a tip cap is inserted into the fragile open tip area. The tip cap can be formed from of a CMC laminate part having a number of plies, generally 20-50 plies, and shaped as the open tip area to fill the open tip area of the CMC preform. Forming the CMC laminate tip cap by cutting out the CMC plies to the desired shape and laying up the plies in the desired geometry is time and labor intensive. Challenges also arise with placing the CMC laminate having a number of plies into the open tip area. Additionally, because both the CMC laminate and preform blade are fragile prior to densifying, these components can be easily damaged during assembly. Known techniques fail to provide robust CMC airfoil systems that suffer from the fallout of parts and significant cost. In addition, known processes suffer from undesirable squeezing of the plies into the hollow cavity of the component during fabrication.

BRIEF DESCRIPTION OF THE INVENTION

In an embodiment, a process of producing a ceramic matrix composite component. The process includes positioning core plies on a mandrel. At least partially rigidizing the core plies to form a preform ceramic matrix composite arrangement defining a tip cavity and a hollow region. Ceramic matrix composite tip plies are positioned on the preform ceramic matrix composite arrangement and within the tip cavity. The ceramic matrix composite tip plies are densified to form a tip region of the composite component.

In another embodiment, a ceramic matrix composite component. The ceramic matrix composite includes one or more densified plies defining a tip cavity and at least one densified ceramic matrix composite tip ply applied to the one or more densified plies. The tip cavity and the at least one densified ceramic matrix composite tip ply form the tip region of the composite component.

Other features and advantages of the present invention will be apparent from the following more detailed description, taken in conjunction with the accompanying drawings which illustrate, by way of example, the principles of the invention.

BRIEF DESCRIPTION OF THE DRAWINGS

FIG. 3 is a sectional view taken in direction 3-3 of FIG. 1 including the tip arrangement, according to an embodiment of the present disclosure.

FIG. 4 is a sectional view taken in direction 3-3 of FIG. 1 including the tip arrangement, according to an alternate embodiment of the present disclosure.

FIG. 5 is a sectional view taken in direction 3-3 of FIG. 1 including the tip arrangement, according to an alternate embodiment of the present disclosure.

FIG. 6 is a sectional view taken in direction 3-3 of FIG. 1 including the tip arrangement, according to an alternate embodiment of the present disclosure.

FIG. 7 is a sectional view taken in direction 3-3 of FIG. 1 including the tip arrangement according to an alternate embodiment of the present disclosure.

FIG. 8 is a sectional view taken in direction 3-3 of FIG. 1 including the tip arrangement, according to an alternate embodiment of the present disclosure.

Wherever possible, the same reference numbers will be used throughout the drawings to represent the same parts.

DETAILED DESCRIPTION OF THE INVENTION

Provided is an economically viable method of forming a ceramic matrix composite (CMC) component, a method of forming a CMC blade, and a CMC component that do not suffer from the drawbacks in the prior art. CMC components, according to the present disclosure, minimize or eliminate additional hand lay-up steps in forming CMC components. Embodiments of the present disclosure, for example, in comparison to concepts failing to include one or more of the features disclosed herein, enable a robust CMC airfoil system that provides reduced or eliminated fallout of parts and reduced cost. In addition, the process and tip arrangement, according to the present disclosure, reduces or eliminates squeezing of the plies into the hollow cavity of the component.

When introducing elements of various embodiments of the present invention, the articles "a," "an," "the," and "said" are intended to mean that there are one or more of the elements. The terms "comprising," "including," and "having" are intended to be inclusive and mean that there may be additional elements other than the listed elements.

Systems used to generate power include, but are not limited to, gas turbines, steam turbines, and other turbine assemblies, such as land based aero-derivatives, used for power generation. In certain applications, the power generation systems, including the turbomachinery therein (e.g., turbines, compressors, and pumps), and other machinery may include components that are exposed to heavy wear conditions. For example, certain power generation system components, such as blades, buckets, casings, rotor wheels, shafts, shrouds, nozzles, and so forth, may operate in high heat and high revolution environments. These components are manufactured using ceramic matrix composites and these components may also be hollow and/or include cooling passages. The present disclosure provides a method to form ceramic matrix composite (CMC) components including hollow structures or cooling passages having robust tip regions following processing. An exemplary embodiment of the disclosure is shown in FIGS. 1-10 as a turbine blade, but the present disclosure is not limited to the illustrated structure.

Figure 1:
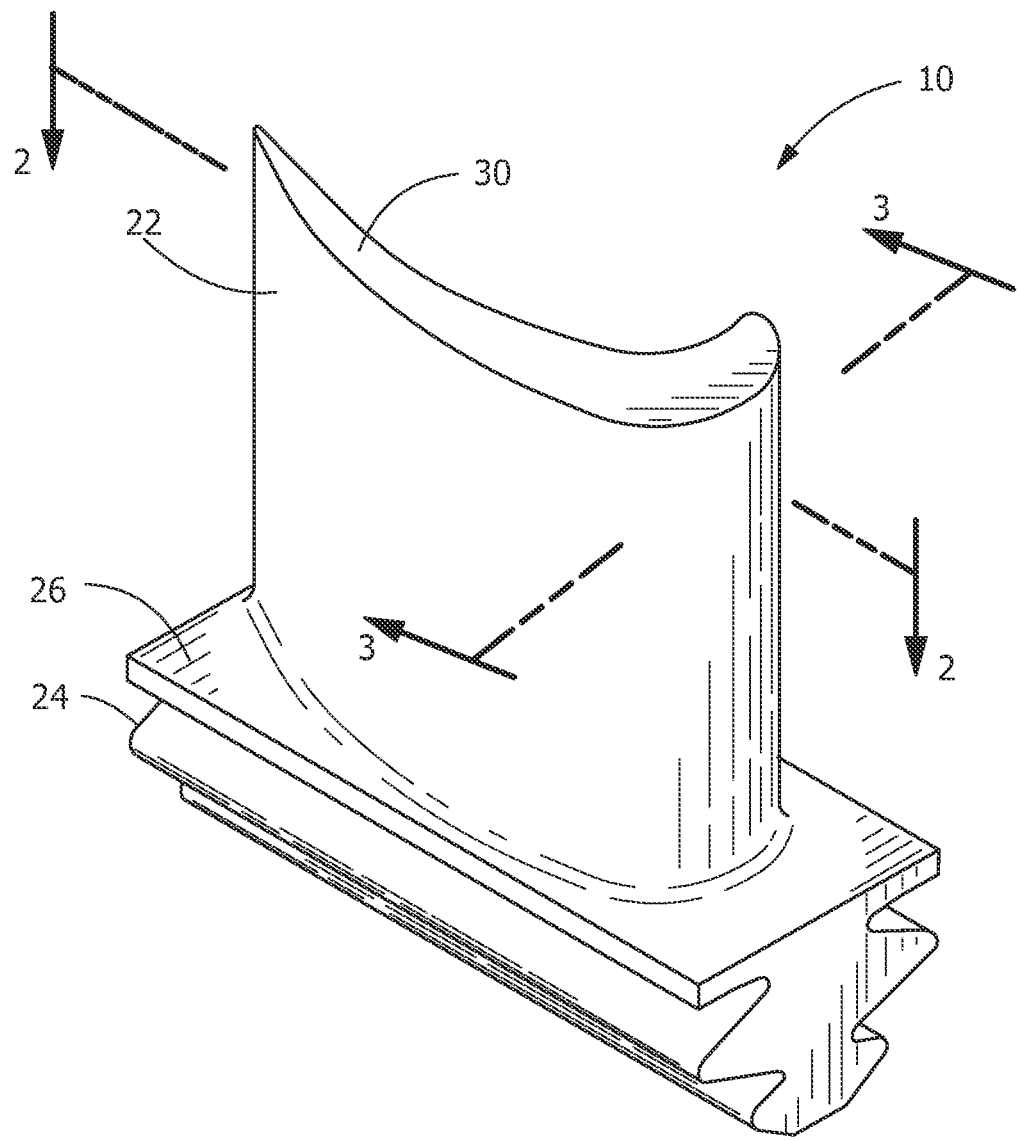
FIG. 1 is a perspective view of a ceramic matrix composite (CMC) component of the present disclosure.
Figure 2:
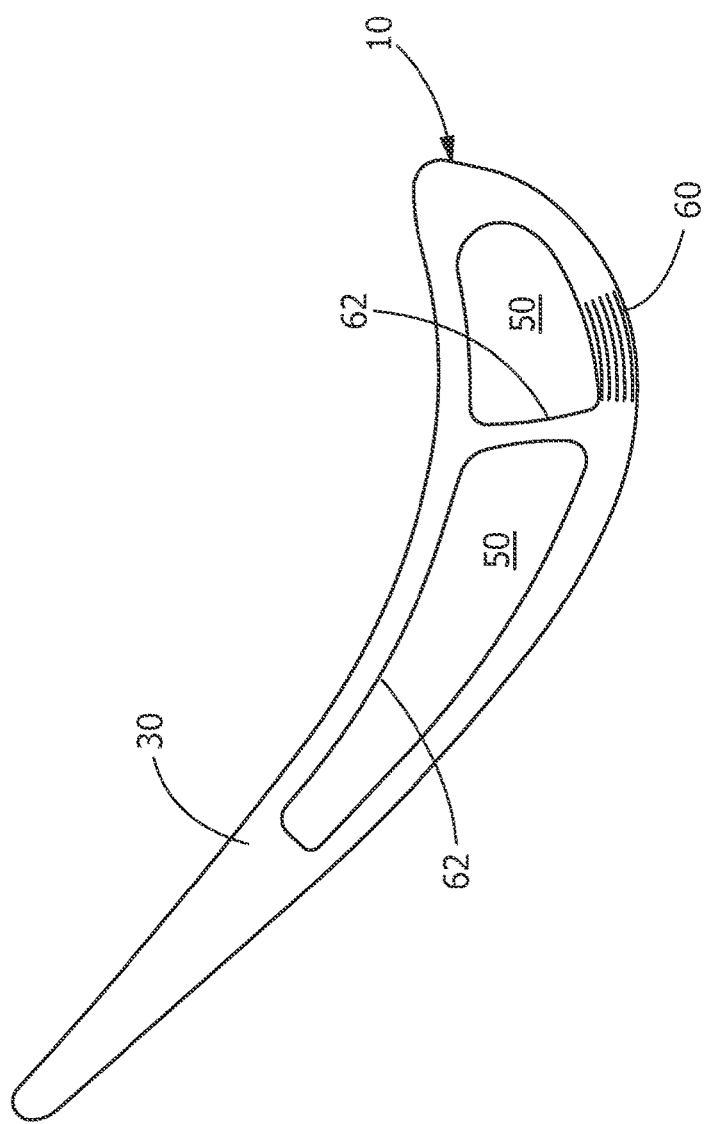
FIG. 2 is a sectional view taken in direction 2-2 of FIG. 1, according to the present disclosure.

FIG. 1 is a perspective view of a component 10, such as, but not limited to, a turbine blade or turbine vane. Although FIG. 1 shows a turbine blade, other suitable components having a tip region 30 may be formed. Component 10 is preferably formed of a ceramic matrix composite (CMC) material. Material for component 10 includes, but is not limited to, oxide based CMCs, such as, but not limited to, alumina, mullite, boron nitride, boron carbide, sialons (silicon, aluminum, oxygen, and nitrogen), intermetallics, and combinations thereof. A suitable example of material for component 10 includes, but is not limited to, AN-720 (oxide-oxide based), which is available from COI Ceramics, Inc., San Diego, Calif., or a hybrid oxide CMC material. Suitable examples of materials used to make components 10, include, but are not limited to, SiC fibers impregnated with a SiC and carbon matrix with various binders. Component 10 includes an airfoil 22 against which the flow of hot exhaust gas is directed. The airfoil 22 extends from tip region 30 to dovetail 24. Component 10 is mounted to a turbine disk (not shown) by the dovetail 24 which extends downwardly from airfoil 22 and engages a slot on the turbine disk. A platform 26 extends laterally outwardly from the area where airfoil 22 is joined to dovetail 24. Component 10 includes at least one internal passage 50, as shown in FIG. 2, extending along the interior of airfoil 22. During operation of a power generation system, a flow of cooling air is directed through internal passage 50 to reduce the temperature of airfoil 22.

Component 10, as shown in FIG. 1, is constructed using a lay-up technique to form a near-net shape preform of a hollow preform ceramic matrix composite arrangement. Formed component 10 is laid-up using any suitable lay-up technique to achieve desired shape and geometry for component 10. Most lay-up techniques used to form components 10 having at least one internal passage 50 include providing and positioning a plurality of plies on a mandrel or other mold. In some embodiments, the mandrel (not shown) is "melted" or leached out of formed component 10 after it has gone through burnout or partial rigidization to form the hollow space or internal passage 50 in the component 10 (see, for example, FIGS. 2-10). Currently, a plurality of plies, generally between 25-50 plies, are used to form a ceramic laminate part or cap, which is placed in the open tip of a blade prior to densification and final melt-infiltration.

FIG. 2 is a sectional view of blade tip region 30 taken in direction 2-2 of FIG. 1 showing internal passages 50 of formed component 10. A plurality of core wrap plies 62 and blade plies 60 (only a few have been shown for clarity) surround and form internal passages 50 of formed component 10.

As shown in FIGS. 3-10, the arrangement of blade tip region 30 is an exemplary embodiment of formed component 10; however, this exemplary embodiment of formed component 10 is for illustrative purposes, and should not be so narrowly construed. Formed component 10 is any preformed CMC component, such as, but not limited to, blades, shrouds and nozzles.

As shown in FIGS. 3-10, the arrangement of tip region 30 includes a plurality of partially rigidized preform ceramic matrix composite plies. As shown in FIGS. 3-10, the partially rigidized preform ceramic matrix composite plies include two types, including core wrap plies 62 and blade plies 60 that form one or more tip cavities 301 into which tip plies 303 are applied. The arrangement of tip region 30 includes a plurality of core wrap plies 62 surrounding internal passage 50 and blade plies 60 surrounding core wrap plies 62 and internal passage 50.

Figure 10:
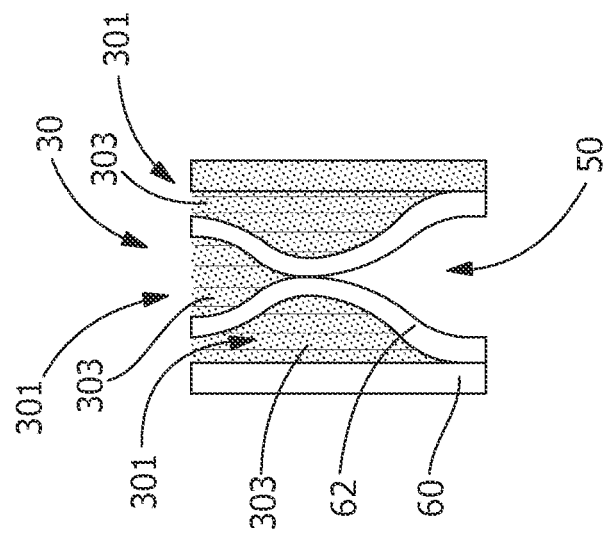
FIG. 10 is a sectional view taken in direction 3-3 of FIG. 1 including the tip arrangement, according to an alternate embodiment of the present disclosure.
Figure 9:
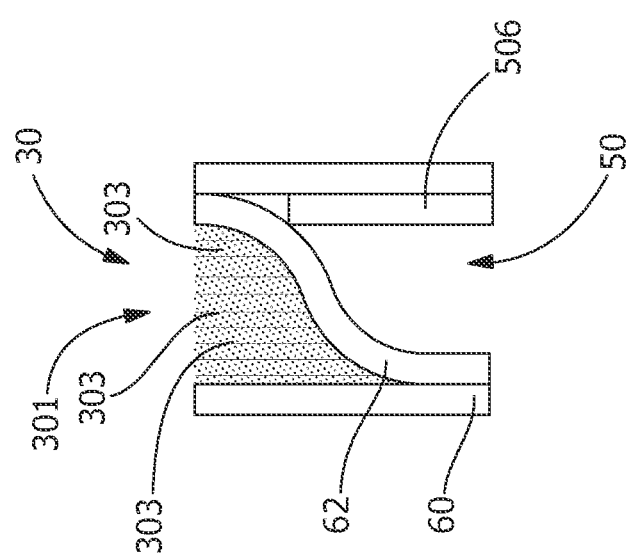
FIG. 9 is a sectional view taken in direction 3-3 of FIG. 1 including the tip arrangement, according to an alternate embodiment of the present disclosure.

As shown in FIG. 3, the blade plies 60 form the outer periphery of the tip region 30 and the core wrap plies 62 are arranged in a curved orientation between blade plies 60, wherein the ends of core wrap plies 62, proximal to the tip region 30, are in contact and form tip cavities 301. The arrangement of FIG. 3, for example, allows for partial to full densification of the core plies 62. FIG. 4 shows an alternate embodiment, the tip region 30 includes a similar arrangement to FIG. 3, wherein the tip region 30 further includes stiffener plies 506 adjacent to core wrap plies 62 to provide additional rigidity and dimensional stability. As shown in FIG. 5, the tip region 30 includes a similar arrangement to FIG. 3, wherein the tip region 30 further includes stiffener plies 506 that extend to the point wherein the core wrap plies 62 contact each other. The arrangement of FIG. 5, like the arrangement in FIG. 4, provides additional rigidity and dimensional stability. The arrangement shown in FIGS. 4-5, for example, enable an enclosed cavity at some radial location off the engine or turbine centerline that is smaller than the tip radial location, which, for example, may be located below the platform. FIG. 6 shows an alternate embodiment, where the blade plies 60 form the outer periphery of the tip region 30 and the core wrap plies 62 are arranged in a curved orientation between blade plies 60, wherein the ends of core wrap plies 62, below the terminus of the tip, are in contact and form tip cavities 301. The arrangement shown in FIG. 6 permits, for example, consistent external tip surfaces and altered tip architecture. FIG. 7 shows an alternate embodiment, where the blade plies 60 form the outer periphery of the tip region 30 and the core wrap plies 62 are arranged in an inverted U-shaped orientation as a continuous ply between blade plies 60 and form a single tip cavity 301. The arrangement of FIG. 7, for example, allows enhanced structural Rigidity of hollow core. FIG. 8 shows an alternate embodiment, where the blade plies 60 form the outer periphery of the tip region 30 and the core wrap plies 62 are arranged in a curved arrangement extending from a surface of one blade ply 60 to another blade ply 60 to form a single tip cavity 301. The arrangement of FIG. 8, for example, allows for varied ply stiffness. FIG. 9 shows an alternate embodiment, the tip region 30 includes a similar arrangement to FIG. 8, wherein the tip region 30 further includes stiffener plies 506 adjacent to blade ply 60 to provide additional rigidity and dimensional stability. FIG. 10 shows an alternate embodiment, where the blade plies 60 form the outer periphery of the tip region 30 and a plurality of core wrap plies 62 are arranged in a curved arrangement extending from surfaces of blade ply 60 and contacting each other below the end of tip region 30 to form a three tip cavity 301.

Figure 11:
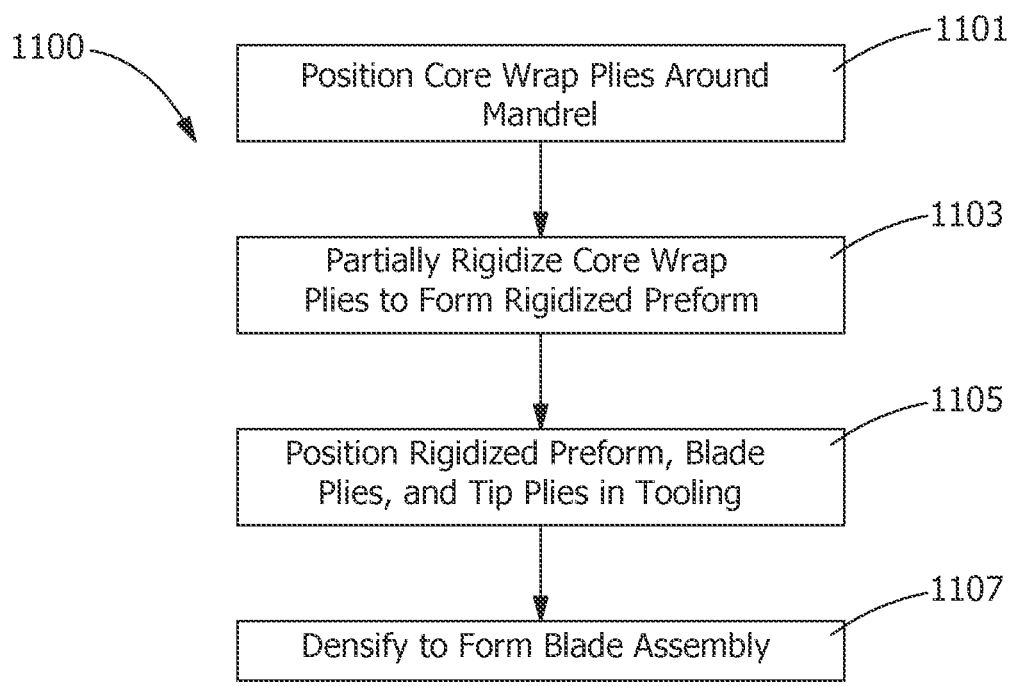
FIG. 11 shows a process of producing a ceramic matrix composite component having a blade tip, according to the present disclosure.

In each of the arrangements shown in FIGS. 3-10, tip cavities 301 are accessible from the end of tip region 30. The tip cavities 301, as shown in FIGS. 3-10, include ceramic matrix composite tip plies 303, or non-fiber based pre-preg ply, that are applied by any suitable technique, such as hand lay-up or similar lay-up process, to substantially fill the tip cavities and form the tip region 30 for consolidation and densification. As shown in FIG. 11, process 1100 includes providing and positioning ceramic matrix composite plies, including core wrap plies 62 on a mandrel. Mandrel, as utilized herein is any suitable tooling or device for forming the ceramic matrix plies into a preform or component having cavities and/or hollow regions. The positioning of the core wrap plies 62 define a hollow preform ceramic matrix composite arrangement having tip cavities (step 1101). After the core wrap plies 62 are positioned, the core wrap plies 62 are partially rigidized to form a rigidize preform ceramic matrix composite arrangement (or rigidized preform) (step 1103). As utilized herein, partially rigidized refers to a curing or rigidization process, such as by autoclave, wherein organics or other volatiles are removed from the core wrap plies 62 to at least partially rigidize the structure. The rigidization includes a sufficient cure to rigidize the structure for further processing. The temperatures and times for partial rigidization vary based upon the desired level of rigidization and the amount and type of matrix present in the plies 60. In another embodiment, the rigidization may further include full rigidization and/or densification. After the rigidized preform is formed, the rigidized preform is positioned in tooling, such as airfoil or other component tooling, wherein blade plies 60, core wrap plies 62 and tip plies 303 are positioned in the tooling (step 1105). Tooling may include, for example, airfoil tooling, or other known tooling arrangements. In one embodiment, the plies are assembled onto the tooling without the use of a mandrel. Examples of material for blade plies 60, core wrap plies 62 and tip plies 303 include, but are not limited to, a single ply or a plurality of plies, such as a series of plies formed into a laminate stack. Examples of material for blade plies 60 and core plies 62 include, but are not limited to, pre-preg composite plies including, for example, woven carbon fiber, binder material and coated SiC fibers. Other suitable materials for plies 60 include oxides containing alumina, zirconia, titania, magnesium, silica, mullite, and/or spinel; carbides containing silicon, boron, and/or titanium; nitrides containing silicon, and boron. Other known fibers suitable for use in the plies 60 include Nextel, Nicalon, hi-Nicalon, Tyranno, and Sylramic fibers. In one embodiment, in addition to the blade plies 60 and the core wrap plies 62, stiffener plies 506 may also be included in the preform ceramic matrix composite arrangement to provide additional rigidity and dimensional stability. In laying-up formed hollow preform ceramic matrix composite arrangement, mandrel or other tooling are utilized and, in one embodiment, these mandrels are melted out of formed hollow rigidized preform to create at least one internal passage 50 (see FIGS. 2-10).

After the rigidized preform, blade plies 60 and tip plies 303 have been positioned in the tooling, the hollow preform CMC arrangement is at least partially densified (step 1107). In one embodiment, the ceramic matrix composite tip plies 303 are oriented in an orientation parallel or substantially parallel to the blade plies 60. Prior to densification, the hollow preform CMC arrangement having tip cavities is placed in an autoclave and an autoclave cycle is completed. The hollow preform CMC arrangement having tip cavities is subject to typical autoclave pressures and temperature cycles used in the industry for ceramic composite materials. Autoclaving pulls out any volatiles remaining in the plies and autoclave conditions can be varied depending on the ply material. After autoclaving, a burn-out process is performed to remove any remaining mandrel material or additional binders in the hollow preform CMC arrangement having tip cavities. The burn-out process is generally conducted at a temperature of approximately 426-648° C. (approximately 800-1200° F.). Densification can be conducted in a vacuum furnace having an established atmosphere at temperatures above 1200° C. to allow matrix material, such as silicon or other materials, to melt-infiltrate into the preform component. The densification may be accomplished using any known techniques for densification, including, but not limited to, Silicomp, melt infiltration (MI), chemical vapor infiltration (CVI), polymer inflation pyrolysis (PIP), and oxide/oxide processes. In one embodiment, the densification is by melt infiltration.

While the invention has been described with reference to one or more embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A process of producing a ceramic matrix composite component having a blade tip, the process comprising:
   positioning core plies on a mandrel;
   positioning blade plies on the core plies;
   at least partially rigidizing the core plies and blade plies to form a preform ceramic matrix composite arrangement defining a tip cavity and a hollow region, wherein the core plies are arranged in a curved orientation between the blade plies across a cross-section of the tip cavity;
   positioning ceramic matrix composite tip plies on the preform ceramic matrix composite arrangement and within the tip cavity; and
   densifying the ceramic matrix composite tip plies to form a tip region of the composite component.

2. The process of claim 1, wherein the at least partially rigidized preform ceramic matrix composite arrangement defines a tip cavity having at least one curved surface.

3. The process of claim 1, wherein the at least partially rigidized preform ceramic matrix composite arrangement defines a tip cavity having at least one rectilinear surface.

4. The process of claim 1, wherein the at least partially rigidized preform ceramic matrix composite arrangement defines a tip cavity having both curved and rectilinear surfaces.

5. The process of claim 1, wherein the at least partially rigidized preform ceramic matrix composite arrangement defines a plurality of tip cavities.

6. The process of claim 1, wherein the at least partially rigidized preform ceramic matrix composite arrangement includes at least partially rigidized preform ceramic matrix composite plies.

7. The process of claim 1, wherein the ceramic matrix composite tip plies are oriented in an orientation substantially parallel to the blade plies.

8. The process of claim 1, further including positioning stiffener plies adjacent to the core plies.

9. The process of claim 1, wherein the densifying includes melt infiltration or chemical vapor deposition.

10. The process of claim 1, wherein the mandrel is removed prior to positioning ceramic matrix composite tip plies.

11. The process of claim 10, wherein the mandrel is removed during the at least partially rigidizing.

12. The process of claim 1, further comprising positioning the preform ceramic matrix composite arrangement, the tip plies and blade plies on tooling prior to densifying the ceramic matrix composite tip plies.

13. A ceramic matrix composite component having a blade tip comprising:
   one or more densified core plies defining a tip cavity;
   a plurality of densified blade plies surrounding the one or more densified core plies, wherein the one or more densified core plies are arranged in a curved orientation curving from a first densified blade plies of the plurality of densified blade ply toward a second densified blade ply of the plurality of densified blade plies across a cross-section of the tip cavity; and
   at least one densified ceramic matrix composite tip ply applied to the one or more densified core plies;

wherein the tip cavity and the at least one densified ceramic matrix composite tip ply form the tip region of the composite component.

14. The ceramic matrix composite component of claim 13, wherein the tip cavity includes at least one curved surface.

15. The ceramic matrix composite component of claim 13, wherein the tip cavity includes at least one rectilinear surface.

16. The ceramic matrix composite component of claim 13, wherein the tip cavity includes both curved and rectilinear surfaces.

17. The ceramic matrix composite component of claim 13, wherein the one or more densified core defines a plurality of tip cavities.

18. The ceramic matrix composite component of claim 13, wherein the at least one densified ceramic matrix composite tip ply is oriented in an orientation substantially parallel to one or more densified blade plies of the plurality of densified blade plies.

19. The ceramic matrix composite component of claim 13, further including one or more stiffener plies adjacent to the one or more core plies.

20. A process of producing a ceramic matrix composite component having a blade tip, the process comprising:
   positioning core plies on a mandrel;
   positioning blade plies on the core plies;
   at least partially rigidizing the core plies and blade plies to form a preform ceramic matrix composite arrangement defining a tip cavity and a hollow region, wherein the core plies are arranged in a curved orientation between the blade plies across the tip cavity;
   positioning ceramic matrix composite tip plies on the preform ceramic matrix composite arrangement and within the tip cavity, wherein the ceramic matrix composite tip plies are oriented in an orientation substantially parallel to the blade plies; and
   densifying the ceramic matrix composite tip plies to form a tip region of the composite component, wherein the hollow region is free of squeezed plies.

* * * * *